United States Patent [19]

Su et al.

[11] Patent Number: 4,999,136

[45] Date of Patent: Mar. 12, 1991

[54] ULTRAVIOLET CURABLE CONDUCTIVE RESIN

[75] Inventors: Wei-Fang A. Su, Murrysville; Anthony P. Barrett, Munhall; Luciano C. Scala, Murrysville; Karl F. Schoch, Jr., Pittsburgh, all of Pa.

[73] Assignee: Westinghouse Electric Corp., Pittsburgh, Pa.

[21] Appl. No.: 235,089

[22] Filed: Aug. 23, 1988

[51] Int. Cl.$^5$ .............................................. H01B 1/06
[52] U.S. Cl. ................................... 252/512; 252/513; 252/514; 252/518; 523/457; 428/901
[58] Field of Search ............ 262/512, 513, 514, 518; 428/371, 901; 525/920, 921, 922, 488, 489; 523/457; 174/68.5; 522/43

[56] References Cited

U.S. PATENT DOCUMENTS

| | | | |
|---|---|---|---|
| 3,957,694 | 5/1976 | Bolon | 25/514 |
| 4,088,801 | 5/1978 | Bolon et al. | 427/54 |
| 4,317,858 | 3/1982 | Sattler | 428/377 |
| 4,357,219 | 11/1982 | Sattler | 204/159.15 |
| 4,362,263 | 12/1982 | Kwiecinski | 428/379 |
| 4,369,207 | 1/1983 | Matsumura et al. | 427/54.1 |
| 4,369,208 | 1/1983 | Okunaka et al. | 427/54.1 |
| 4,401,686 | 8/1983 | Durand | 427/13 |
| 4,411,980 | 10/1983 | Haney et al. | 430/291 |
| 4,420,500 | 12/1983 | Nakatani et al. | 252/512 |
| 4,420,541 | 12/1983 | Shay | 428/523 |
| 4,431,683 | 2/1984 | Sasaki et al. | 427/39 |
| 4,460,427 | 7/1984 | Haney et al. | 156/303 |
| 4,469,777 | 9/1984 | O'Neil | 430/315 |
| 4,481,258 | 11/1984 | Sattler | 428/371 |
| 4,491,605 | 1/1985 | Mazurek et al. | 427/38 |
| 4,524,087 | 6/1985 | Engel | 427/2 |
| 4,610,808 | 9/1986 | Kleiner | 252/518 |
| 4,618,632 | 10/1986 | Su | 522/43 |

Primary Examiner—Josephine Barr
Attorney, Agent, or Firm—A. Mich, Jr.

[57] ABSTRACT

A UV curable electrically conductive adhesive has been developed with low resistivity, adequate lap shear strength, good thermal stability, and very stable conductivity at high temperatures of about 100° C. and high humidity. The adhesive may be applied by silk screen printing and cured by UV in about 8 seconds. The adhesive may also be used as a replacement of solder in automated surface mount technology for electronic circuit fabrication. The adhesive is a mixture of (A) a blend of an acrylate epoxy and a urethane, a copolymer of an acrylate epoxy and a urethane, or mixtures thereof; (B) a polyfunctional acrylate monomer; (C) a photoinitiator, and (D) a conductive filler. Optionally, adhesion promoters and flow control agents may be used.

13 Claims, 2 Drawing Sheets

ULTRAVIOLET CURABLE CONDUCTIVE RESIN

BACKGROUND OF THE INVENTION

1. Field of the Invention

The present invention relates to an ultraviolet (UV) curable conductive resinous composition, and more specifically to an electrically conductive resinous composition that may be used as an adhesive and/or solder paste, and electronic circuit assemblies using the resin of the present invention.

Typical thermally cured compositions contain large amounts of solvent which must be boiled off before the resin may be cured, thus creating potential ecological problems. Furthermore, thermally cured resins are costly in terms of wasted energy, elimination of large quantities of solvent, and slower production times. Generally, thermal cure processes require a long cure time which makes automation of a manufacturing process difficult. (See U.S. Pat. Nos. 4,481,258; 4,362,263; 4,420,500; and, 4,369,207.)

Conventional commercially available epoxy base conductive adhesives usually require curing at elevated temperatures for about 10 minutes, or at room temperature for extended times usually about 24 hours. Because of the long curing time, these adhesives are not suitable for automated in-line assembly.

UV curable conductive coatings provide extremely fast UV cure rates, which makes automation of electronic circuit assemblies possible. UV curable conductive coatings may also be used to make connections where heat cannot be tolerated, and for repairing heat-sensitive components. (See, for example, U.S. Pat. Nos. 3,957,694; 4,088,801; 4,401,686; 4,362,263; 4,420,541; 4,431,683; 4,369,208; 4,411,980; 4,460,427; 4,469,777.)

2. Description of the Prior Art

Ultraviolet radiation (UV) curing technology has been adopted in manufacturing in order to improve quality, increase productivity, and reduce emissions of volatile organic compounds. UV curable compositions provide high cure speeds and solventless resin systems. Generally, a UV cured composition has a high solids content and is a totally reactive resin that can be applied in a single pass.

There are many potential applications for electrically conductive adhesives in the electronic industry such as chip bonding, electrostatic shielding, corona shielding, repair of printed circuit boards, adhesive work, ignition cable, sheet coatings, the manufacture of electrodes, contacts, terminations, surfaces receptive to plating, hybrid circuit paths, land areas, die attachment, surface mount component attachment (SMT), bonding of electromagnetic interference/radio frequency interference (EMI/RFI), conductive paths, lead attachment, grounding, hybrid circuit assembly, lamination of dissimilar metals and plastics, lid bonding, circuit repair work, and connector attachment.

Conductive adhesives have certain unique properties that make them particularly attractive for use in attaching components to printed circuit boards. One advantage is that these adhesives provide a much simpler assembly procedure, than do wave solder or reflow solder processes.

In spite of these disclosures, there remains a need for an ultraviolet curable conductive adhesive that may also be used as solder, may be suitable for use in automated surface mount technology or electronic circuit fabrication, has low resistivity, adequate lap shear strength, good thermal stability, stable conductivity at high temperature and high humidity, and other properties that allow for a wide range of uses in the electronic industry.

SUMMARY OF THE INVENTION

The present invention has met the above-described need by providing a ultraviolet curable electrically conductive adhesive with low resistivity, adequate lap shear strength, good thermal stability, and stable conductivity at high temperature and humidity. The adhesive may be applied by silk screen printing or by automated syringe dispenser.

The material may also be used for replacement of solder in automated surface mount technology for electronic circuit fabrication.

The conductive UV curable adhesive may be used as an adhesive on an electronic circuit board and may be used in combination with staking adhesives and/or conformal coatings, to provide a finished circuit board.

It is an object of the present invention to provide an electrically conductive UV curable adhesive.

It is another object of the present invention to provide an adhesive composition that may be used as solder paste.

It is a further object of the present invention to provide a method of making an electrically conductive ultraviolet curable adhesive.

It is an object of the present invention to provide an electrically conductive UV curable adhesive that has low resistivity, adequate lap shear strength, good thermal stability, and stable electrical conductivity at high temperature and high humidity.

It is another object of the present invention to provide an electrically conductive ultraviolet curable adhesive that may be applied to a substrate by silk screen printing.

It is an object of the present invention to provide an electrically conductive ultraviolet curable adhesive that may cure at high speeds.

It is another object of the present invention to provide an electrically conductive ultraviolet curable adhesive that is a one-part system.

It is a further object of the present invention to provide an ultraviolet curable electrically conductive adhesive that may be applied in one step.

These and other objects of the present invention will be more fully understood from the following illustrations describing the invention.

DETAILED DESCRIPTION OF THE PREFERRED EMBODIMENTS

Ultraviolet curing technology has been adopted by the manufacturing industry in order to improve quality and increase productivity, and reduce volatile organic compound emission. Ultraviolet curing provides high cure speeds and solventless resin systems. Ultraviolet curable resins usually can be cured at high speeds at room temperature on exposure to the appropriate UV wavelength. As a result, there is no damage to heat-sensitive components, and the materials have a long shelf life.

The adhesive of the present invention forms a one-part system and is compatible with in-line assembly. Specifically, the conductive adhesive has a low resistivity of about $2 \times 10^{-4}$ ohm-cm, adequate lap shear strength of about 992 psi, good thermal stability, and very stable electrical conductivity at high temperatures of about 85° to 100° C., and high humidity at about 85% RH.

The adhesive of the present invention may be applied by silk screen printing or automated syringe dispenser, and cured by ultraviolet radiation in a very short time of less than about 8 seconds. The rapid curing of the adhesive of the present invention enables these adhesives to be used in automated surface-mount technology for electronic circuit fabrication. A nonconductive staking adhesive or conformal coating may also be used on a printed wiring board (PWB), and the entire system may be cured.

Figure 1:
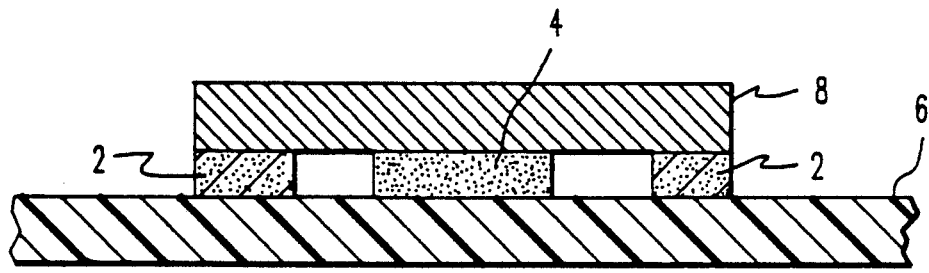
FIG. 1 illustrates a cross section of a electronic component to printed circuit board assembly using a conductive adhesive of the present invention and nonconductive adhesives.

FIG. 1 illustrates a cross-sectional view of a device where the electrically conductive adhesive 2 of the present invention is alternated with a nonconductive adhesive 4, such as a nonconductive staking adhesive. Both adhesives, 2 and 4, are applied between a substrate 6 and a chip carrier or electronic component 8.

The use of the electrically conductive UV curable adhesive provides a simpler application process and may be used as a replacement for solder. Reflow solder application usually requires tin component leads, screen printing the solder paste on the PC board, dot dispensing the nonconductive adhesive, mounting the components on the PC board, prebaking the assembled circuit, applying the reflow solder, cleaning the soldered assembly, and testing the printed circuit (PC) board.

The conductive adhesives of the invention may be used as solder replacement and requires only the steps of screen printing the conductive adhesive, dot dispensing the nonconductive adhesive for mounting components on the PC board, curing the adhesives with UV radiation, and testing the PC board. Furthermore, use of the electrically conductive UV curable adhesive is superior to solder because the adhesive more easily accommodates the mismatch in thermal expansion between the low thermal expansion of the ceramic chip carrier or electronic component 8 and the high thermal expansion of the substrate or board 6. As a result, there is a reduction in microcracking and the system assembled with the adhesive of the present invention as compared to use of the traditional solder.

The replacement of solder by conductive adhesive also eliminates the problems associated with wicking, tombstoning, metal leaching, and use of corrosive solvents.

The composition of the electrically conductive ultraviolet curable adhesive of the present invention is a mixture of (A) an adhesive binder of a blend of acrylate epoxy and urethane described in U.S. Pat. No. 4,481,258 herein incorporated by reference, a copolymer of an acrylate epoxy and urethane, and mixtures thereof; (B) a polyfunctional acrylate monomer; (C) a photoinitiator; and, (D) a conductive filler. The conductive filler is mixed with the other components to form a one-system adhesive. Optionally, additives such as adhesion promoters and flow control agents may be used in the adhesive composition.

Component (A) is preferably the blend of acrylate epoxy and urethane described in U.S. Pat. No. 4,481,258. The copolymer of an acrylate epoxy and urethane may also be used as component (A) or in mixture with the composition of U.S. Pat. No. 4,481,258.

Specifically, the blend of acrylate epoxy and urethane of U.S. Pat. No. 4,481,558 comprises about 20 to about 40% by weight of an acrylated epoxy which is the reaction product of an epoxy resin and an acrylate adduct. The acrylate adduct is the reaction product of an acrylate which may be either 2-hydroxyethyl acrylate, 2-hydroxy-propyl acrylate, 2-hydroxyethyl methacrylate or mixtures thereof, and an anhydride, which may be phthalic anhydride, maleic anhydride, trimellitic anhydride, or mixtures thereof.

The composition also includes about 4 to about 15% by weight of an acrylated blocked isocyanate which is the reaction product of caprolactam and an acrylated isocyanate. The acrylated isocyanate is the reaction product of an acrylate which can be 2-hydroxyethyl acrylate, 2-hydroxypropyl acrylate, 2-hydroxyethyl methacrylate, or mixtures thereof, with an isocyanate which can be toluene diisocyanate, 4,4'-diisocyanato diphenyl methane, or mixtures thereof. The composition also includes about 45 to about 65% by weight of a mono-acrylate of which at least 60% by weight is phenoxyethyl acrylate, about 5 to about 20% by weight of a polyacrylate of which at least about 50% is triethylene glycol diacrylate, about 2 to about 5% of a photoinitiator, and about 0.05 to about 0.3% by weight of an inhibitor.

The copolymer may be prepared using an epoxy resin which should be a bisphenol A epoxy resin or a bisphenol-S-epoxy resin, as these epoxy resins promote adhesion of the adhesive to the surface. A bisphenol A epoxy resin is most preferred because it is less expensive. The epoxy resin should also be soluble in a liquid acrylate, which is used as a solvent for the reactants. The liquid acrylate is later reacted into the adhesive. Examples of suitable liquid acrylates include phenol ethoxylate monoacrylate, tetrahydrofurfuryl methacrylate, cyclohexyl methacrylate, n-hexyl methacrylate 2-(2-ethoxy ethyoxy) ethyl acrylate and mixtures thereof. The preferred liquid acrylate is phenoxy ethyl acrylate (PEA). Sufficient liquid acrylate of about 10 to 50% (by weight) should be used to give the resin a workable viscosity.

An epoxy catalyst, a tertiary amine, such as triethylamine, triethanolamine, benzyldimethylamine, and mixtures thereof, is also included in the resin. Generally, at least about 0.01% (all percentages herein are by weight unless otherwise indicated) catalyst (based on the weight of copolymer) is required, and more than about 0.1% catalyst should be avoided as it causes the polymer to gel and may result in clouding.

A dual functional acrylate monomer or reactant is used to react with epoxy to obtain an acrylate epoxy urethane copolymer. Isocyanato ethyl methacrylate manufactured by Norquay Technology Inc., Chester, PA, is a preferred monomer. The dual functional reactant may also be prepared by reacting one mole of hydroxy terminated acrylate, such as hydroxy ethyl acrylate, with one mole of diisocyanate such as toluene diisocyanate. Other Examples of suitable hydroxy terminated acrylates include 3-hydroxy-propyl acrylate, 2-hydroxy methaacrylate, hydroxyethyl-beta-carboxyethyl acrylate, 3-hydroxypropyl methacrylate, hydroxyhexyl acrylate, hydroxyoctyl metacrylate, 2-hydroxy-propyl acrylate and 2-hydroxyethyl methacrylate. The hydroxy ethyl acrylate is preferred because of its high reactivity. Other aliphatic and aromatic diisocyanates also can be used to make acrylate isocyanate monomer including:

4,4'-diisocyanato diphenyl 2,2-propane (4,4'-diphenyl-2,2-propane diisocyanate)
4,4'-diisocyanato diphenyl methane (4,4'-diphenylmethane diisocyanate)
4,4'-diisocyanato benzidine (4,4'-diphenyl diisocyanate)
4,4'-diisocyanato diphenyl sulfur (4,4'-diphenylsulfide diisocyanate)
4,4'-diisocyanato diphenyl sulfone (4,4'-diphenylsulfone diisocyanate)
4,4'-diisocyanato diphenyl ether (4,4'-diphenylether diisocyanate)
(4,4'-diisocyanato diphenyl 1,1-cyclohexane (4,4'-diphenyl-1,1-cyclohexane diisocyanate)
oxides of methyl- and of bis (meta-isocyanato-phenyl) phosphine (methyl and bis(meta-phenylisocyanate) phosphine oxide)
diisocyanato 1,5-naphthalene (1,5-naphthalene diisocyanate)
meta-phenylene diisocyanate
tolylene diisocyanate (toluylene diisocyanate or toluene diisocyanate)
3,3'-dimethyl diphenyl 4,4'-diisocyanate (dimethyl 3,3'-diisocyanato 4,4'-diphenylene)
3,3'-dimethoxy diphenyl 4,4'-diisocyanate (dimethoxy 3,3'-diisocyanato 4,4'-diphenylene)
meta-xylylene diisocyanate
para-xylylene diisocyanate
4,4'-dicyclohexylmethane diisocyanate (diisocyanato 4,4'-dicyclohexyl methane)
hexamethylene diisocyanate
dodecamethylene diisocyanate
2,11-dodecane diisocyanate (diisocyanate 2,11-dodecane)
bis(para-phenylene isocyanate 1,3,4-oxadiazole) paraphenylene
bis(para-phenylene isocyanate), 1,3,4-oxadiazole
bis(meta-phenylene isocyanate), 1,3,4-oxadiazole
bis(meta-phenylene isocyanate)4-phenyl 1,2,4-triazole
bis(4-paraphenylene isocyanate thiazole 2-yl) metaphenylene
(2-phenylene)5,4'-benzimidazole diisocyanate
(2-phenylene)5,4'-benzoxazole diisocyanate
(2-phenylene)6,4'-benzothiazole diisocyanate
2,5-bis(2-phenylene isocyanate benzimidazole-6-ene) 1,3,4-oxadiazole
bis(para-phenylene isocyanate-2-benzimidazole-6-ene)
bis(para-phenylene isocyanate-2-benzoxazole-6-ene)
and mixtures thereof The copolymer is usually obtained by reacting one mole of epoxy resin with one mole acrylate isocyanate monomer. The molar ratio range of epoxy to acrylate isocyanate is about 1:1 to 1:5. If the ratio is less than about 1:1, the curing rate may be too slow and if the ratio is higher than 1:5, the adhesive bond may be too brittle.

More specifically, the copolymer is prepared by charging 0.2 g of benzoquinone, 730 g of a bisphenol A epoxy resin, having an epoxy equivalent weight of 912, 793.2 g of phenoxyethyl acrylate and 1 g of triethylamine into a three-liter reaction flask equipped with a stir, thermometer, nitrogen sparge, and a heating mantle. A suitable bisphenol A epoxy resin is Epon 1004F, a trade product of Shell Chemical Company. The mixture is heated to about 80° until all of the epoxy is dissolved. The mixture is then cooled to about 50° C. and 62 g of isocyanato ethyl methacrylate is added. The reaction mixture is heated to 60° C. until all of the isocyanate is reacted, usually about one hour. Then 793.2 g of tetraethyl glycol diacrylate (TEGDA), 95.18 g of 2,2-dimethoxy-2-phenylace-tophenone, 4.76 g of benzyldimethylamine, and 2.38 g of a fluorocarbon surfactant (FC-430, a product of 3M), are added and mixed well.

Component (B) is a polyfunctional acrylate monomer. It is preferred that the polyfunctional acrylate monomer be difunctional or trifunctional, as monomeric acrylates have a slow cure rate and tetrafunctional acrylate monomers provide a brittle adhesive bond.

Suitable difunctional acrylate monomers include 1,3-butylene glycol diacrylate, 1,4-butandiol diacrylate, diethylene glycol diacrylate, 1,6-hexanediol diacrylate, 2,2-dimethylpropane-1,3-diacrylate, tetraethylene glycol diacrylate (TEGDA), and tripropylene glycol diacrylate.

Suitable trifunctional acrylate monomers include trimethylpropane diacrylate, pentaerythritol triacrylate, ethoxylated trimethylol propane triacrylate, and glyceryl propoxy triacrylate (GPTA).

The polyfunctional acrylate monomer may be mixtures of difunctional monomers and trifunctional monomers. It is preferred that the polyfunctional acrylate monomer is TEGDA, GPTA; or mixtures thereof. These monomers reduce viscosity and increase bond strength.

The photoinitiators suitable for use in the present invention include benzoin ether derivatives, alpha-acryloxime ester derivatives, acetophenone derivatives, and ketone-amine combinations.

Examples of suitable photoinitiators include: isobutyl benzoin ether (V-10, a product of Stauffer Chemicals), isopropyl benzoin ether, benzoin ethyl ether, benzoin methyl ether, 1-phenol-1,2-propane-dione-2-(0-ethoxycarbonyl) oxime, 2,2-dimethoxy-2-phenyl-acetophenone (IRG-651, a product of Ciba Geigy), benzyl hydroxy-cyclo-hexyl phenyl ketone, diethoxyacetophenone, 2-hydroxy-2-methyl-1-phenyl-propane-1-one.

The ketone-amine combination is preferably a primary or secondary, aliphatic or aromatic amine or ketones which include benzophenone, chlorothioxanthone, 2-chlorothioxanthone, isopropyl thioxanthone, 2-methyl-thioxanthone, chlorine functional substituted benzophenone, halogen substituted alkyl-arylketones, wherein halogen is chlorine, bromine, or iodine. The photoinitiator may be mixtures of the above-described suitable photoinitiators.

Suitable optional adhesion promoters include acrylate phosphate ester photoinitiators (EB-19-6170, a product of Radcure Inc.), acrylate sulfide derivatives, and mixtures thereof.

Suitable, optional flow control agents include alkyl phenol ethoxylate, alcohol ethoxylate, fluorinated alkyl alkoxylate, fluorinated alkyl ester (FC-430, a product of 3M), ether sulfate, and mixtures thereof.

Component (D) may be any metal, but is preferably silver, iron, copper, and nickel. The silver is most preferred as it provides the best conductivity. It is preferred that a pure metal be used as the conductive filler and be in the form of a flake or powder. However, metal-coated materials may also be used and they provide a lighter weight to the adhesive. Suitable metal-coated materials include metal-coated glass beads, metal-coated mica, metal-coated glass or mica flakes, and mixtures thereof.

It has been surprisingly found that particle size should be less than 16 microns. This particle size provides enhanced conductivity as compared to larger particle sizes above the 16 microns. The larger particle size produces decreased conductivity and increased UV cure time.

It is preferred that the ratios of component (A) to component (B) to component (C) to component (D) be about 5 to 20:5 to 20:1 to 7:60 to 80 wt. percent. Additives, such as flow control agents and adhesion promoters, may be present in an amount of about 0.01 to 0.1 wt. percent.

Table 1 discloses the presently preferred compositions and electrical properties of the compositions of the present invention.

Table 2 discloses certain physical properties of the adhesives of the present invention.

TABLE 2-continued

| Sample Cured 1 hr @ 150° C. | |
|---|---|
| Adhesion Properties (Crosshatch Test) (ASTM D3359) | FR-4 - 100% Copper - 100% Aluminum - 100% |

The adhesives of the present invention, as prepared, are thioxotropic pastes. Their viscosities were measured by a Brookfield viscometer at room temperature.

The adhesives were applied on FR-4 epoxy laminate boards by screen printing, automated syringe dispensing, or doctor blading. They were cured by exposure to Fusion Systems' lamps with H and D bulbs at 20 ft/min, which was equivalent to 2 seconds UV exposure. The conductive adhesive required about 8 seconds to cure. The resistivity measurement of the conductive adhesive was carried out using a four-probe array method according to the procedures of ANSI/ASTM F-84-73.

Adhesion of the materials was measured using the modified peel test apparatus. In this arrangement, the hook was placed over the test piece, such as electronic component, and lead shot added to the bucket until the component breaks loose. Thus, a relative measure of the adhesive strength of the various formulations could be determined in a test that simulates actual use. The bond strength of the adhesives was also determined on Al/Al by the ASTM D1002 lap shear test. The adhesion properties of adhesives were further evaluated by the crosshatch tape test on different substrates such as copper,

TABLE 1

| Formulation | % Composition (wt.) | | | | | Silver Conductive Filler | | | Resistivity ohm-cm | Screen Printable |
| | TEGDA | GPTA | B562 | V-10 | EB19-6170 | % wt. | Type | Particle Size μm | | |
|---|---|---|---|---|---|---|---|---|---|---|
| KFS 13-20 | 8.75 | — | 13.25 | 3.01 | 0.044 | 75 | SF-325 | 0.5–10 | 0.00020 | Yes |
| KFS-13-21 | 8.75 | — | 13.25 | 3.01 | 0.044 | 75 | SF-135 | 2–15 | 0.05900 | Yes, with difficulty |
| KFS-13-7 | 9.80 | — | 14.84 | 3.37 | 0.049 | 72 | SF-131 | 1–12 | 0.30000 | Yes |
| KFS 13-15 | 7.00 | — | 10.60 | 2.41 | 0.035 | 80 | SF-131 | 1–12 | Cannot be cured by UV | |
| KFS-13-8 | 9.8 | — | 14.84 | 3.37 | 0.049 | 72 | SP-300 | 1 | Too dry to screen | |
| CGL 152-1 | 10.98 | — | 8.85 (B562) 7.65 (12061-4) | 5.52 (IRG 651) | 0.068 | 60 | SF-135 | 2–15 | 0.00516 | Yes |
| CGL 143-2 | 9.90 | — | 8.85 (B562) 6.90 (12061-4) | 5.52 (IRG 651) | 0.068 | 70 | SF-135 | 2–15 | 0.00720 | No; too dry |
| CGL 151-1 | 9.90 | — | 7.98 (B562) 6.90 (12061-4) | 4.98 (IRG 651) | 0.068 | 55 15 | SF-135 SF-235 | 2–15 0.5–10 | 0.00729 | Yes, with difficulty |
| 1 | — | 13.0 | 8 | — | — | 78.3 | * | — | 0.0129 | — |
| 2 | — | 10.7 | 7.1 | — | — | 82.2 | * | — | 0.0126 | — |
| 3 | — | 36.0 | 24 | — | — | 40.0 | SF-20 | — | 0.11 | |

*Silver powder
TEGDA -Tetraethylene glycol diacrylate
B562 - Acrylate epoxy resin, Westinghouse, IMD, Manor, Pennsylvania
12061-4 - Acrylate epoxy resin, Westinghouse R&D
V-10 - Isobutyl benzoin ether, photoinitiator, Stauffer
IRG 651 - benzoin ether derivative, photoinitiator, Ciba-Geigy
EB19-6170 - Acrylate ester derivative, adhesion promoter, Radcure Specialties, Inc.
SF-135 - Silver conductive Filler, Handy & Harman Chemical Products
135 - Silver conductive Filler, Handy & Harman Chemical Products
235 - Silver conductive Filler, Handy & Harman Chemical Products
SF-20 - Silver coated glass spheres, PA Industries
SP-300 - Silver coated glass bead, Potter Industries

TABLE 2

| Formulation | KFS 13-20 |
|---|---|
| Type | Silver filled |
| Consistency | Thixotropic paste |
| Viscosity (cps, 23° C.) | 37,338 |
| No. Components | 1 |
| Cure Schedule | 10 sec at R.T. (UV) |
| Volume Resistivity (ohm-cm) | $2 \times 10^{-4}$ |
| Tg: UV Cure 10 sec @ R.T | 40 |
| UV Plus 2 hr @ 80° C. | 70 |
| Max. Temp. (continuous) | 150° C. |
| Max. Temp. (intermittent) | 400° C. (TGA) |
| Lap Shear Strength (psi) (ASTM D1002) | 992 | aluminum, and FR-4, according to the procedures of ASTM D3359.

The thermal properties of the adhesives were determined by thermal mechanical analysis (TMA) and thermogravimetric analysis (TGA). The TMA study was carried out with a Perkin-Elmer TMS-2 using the penetration mode, with a probe diameter of 0.035 inch under a 110 gram load at a 10° C./min heating rate from −30° C. to 200° C. under helium atmosphere. The TGA study was carried out with a Perkin-Elmer TGS-2 at a 5°

C./min heating rate from room temperature to 800° C. under nitrogen atmosphere.

Table 3 shows the processing advantage of the UV curable conducting adhesives of the present invention over conventional metal-filled adhesives, such as Epotek H20E, an amine-cured bisphenol A, a trade product of Epoxy Technology, Inc.

TABLE 3

COMPARISON OF UV CURABLE CONDUCTING ADHESIVES WITH CONVENTIONAL METAL FILLED ADHESIVES

| Characteristic | Westinghouse UV Adhesive | Conventional Metal Filled Adhesive |
| --- | --- | --- |
| Cure Schedule | <10 Sec at Ambient | 10 Min at 150° C. |
| Damage to Heat Sensitive Components | No | Yes |
| In-Line Assembly | Yes | No |
| Mixing Requirements | One-Package | Two-Packages |
| Shelf Life | Indefinite | <4 Days at 25° C. |

LONG-TERM STABILITY OF CONDUCTIVE ADHESIVE TO MOISTURE AND TEMPERATURE VARIATIONS

Figure 2:
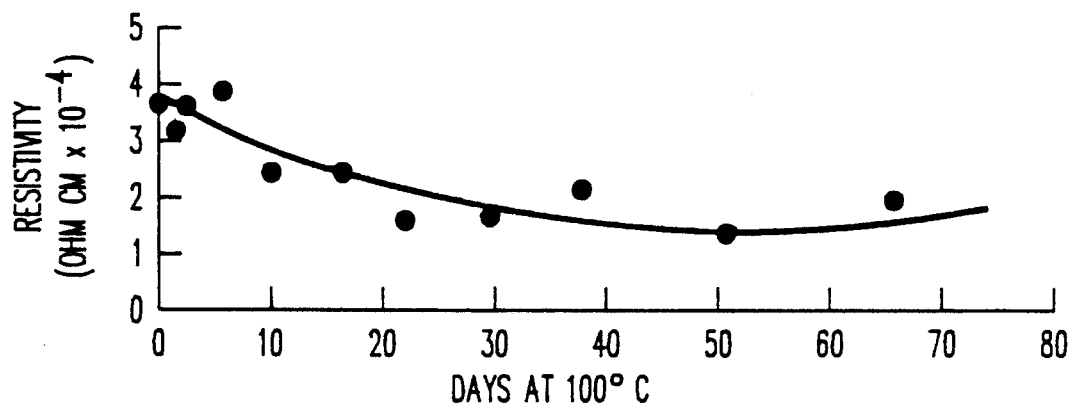
FIG. 2 illustrates thermal aging data for the conductive adhesive of the present invention.

Thermal and humidity stability of UV curing conductive adhesives have been evaluated by several methods. The behavior of the resistivity of thin film samples of the adhesives versus time at temperature (65 days at 100° C.) is shown in FIG. 2. During the first 10 days, the resistivity of the adhesive decreased slightly, which was probably due to further curing of the adhesive, then it reached a plateau for the remainder of the test period.

More extensive tests were conducted at 85° C. with and without 85% relative humidity. For accuracy in testing, it was decided to arrange the 10 SMT resistors in series. The use of resistors in series provides the resistance values, calculated from the voltages read at the nodes of the circuit arrangement, that are all based on a single identical measured shunt current, thereby minimizing measurement variabilities if multiple paths and currents had been used. The purpose of this series of tests was to check the adhesive performance while undergoing various combinations of voltage and current density levels, simulating actual application conditions. The potential problems tested under these conditions included physical migration of the conductive particles, moisture absorption, and temperature stability of the formulation.

Figure 3:
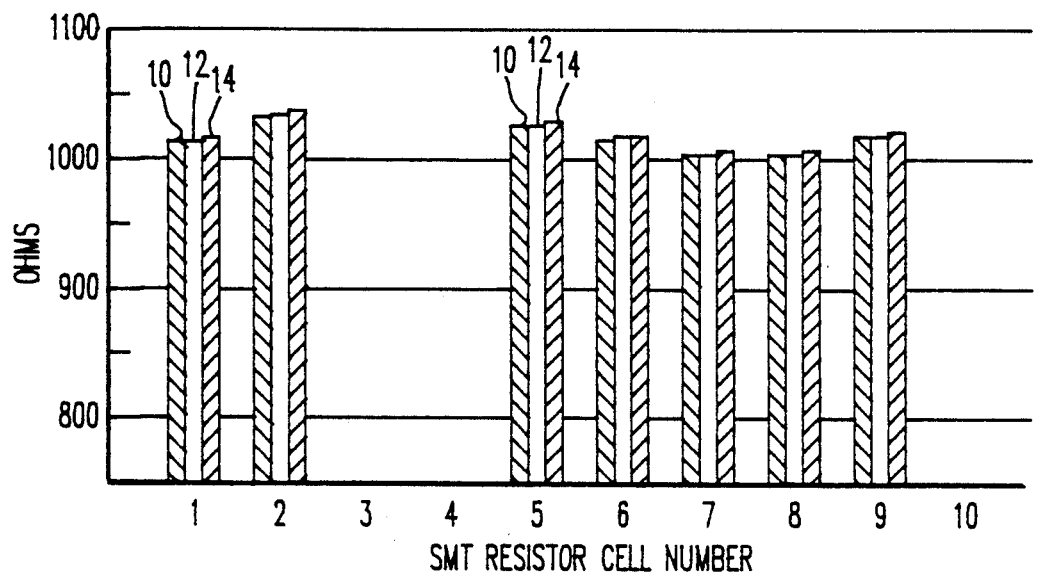
FIG. 3 illustrates the performance of the conductive adhesive of the present invention as solder at 6 V, 85° C., and 85% RH.
Figure 4:
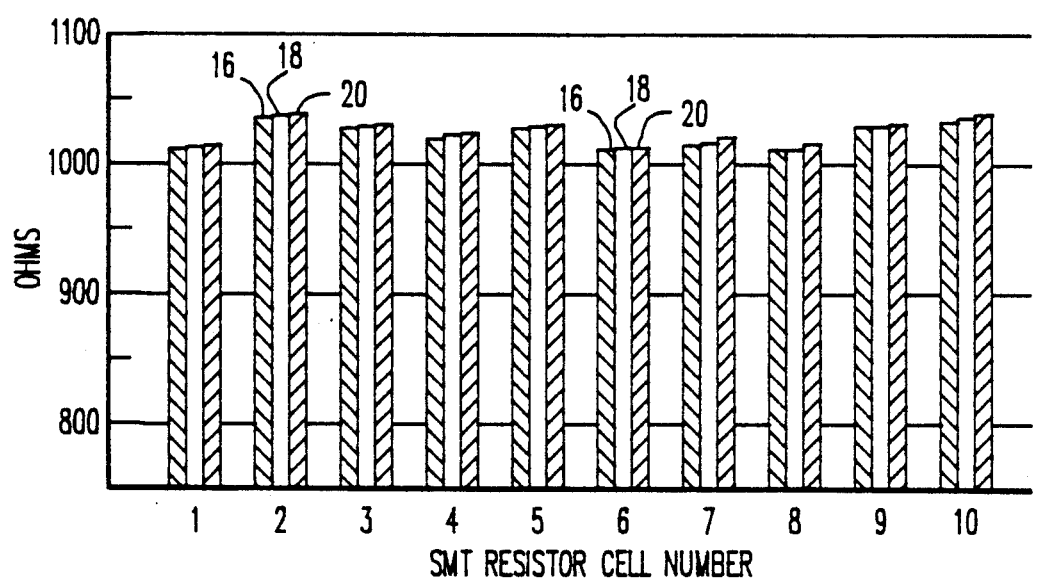
FIG. 4 illustrates the performance of conventional solder at 6 V, 85% RH, and 85° C.

Any one of these potential problems manifests itself as a markedly abnormal change in resistance of the SMT resistor cell for which the formulation was providing the series connection path. The shunt resistor which provided the current reading was outside and separated from the environment of the test boards. Tests were conducted for time periods of 24 to 30 hours in an attempt to integrate and eliminate any deleterious effects from the circuit and environmental stresses that were applied. Results of these tests are summarized in FIG. 3 which shows the minimum 10, maximum 14 and initial 12 values observed for resistance of each of the ten 100-ohm resistors on the board. Resistors with no data given are those in which contacts were shorted out by the adhesive during the board assembly process. FIG. 4 illustrates the results of two boards containing resistors attached with solder in the conventional way for comparison purposes with the minimum 16, maximum 20 and initial 18 values observed. The solder used in this test was Alloy Sn-60 Ersin multicore, a product of Multicore Solder, Inc., England. The measured resistances were all near 1090 ohm and the variation in the readings during the test was very small (~2 ohm). The nearly constant values indicate predictable and reproducible circuit performance.

Figure 5:
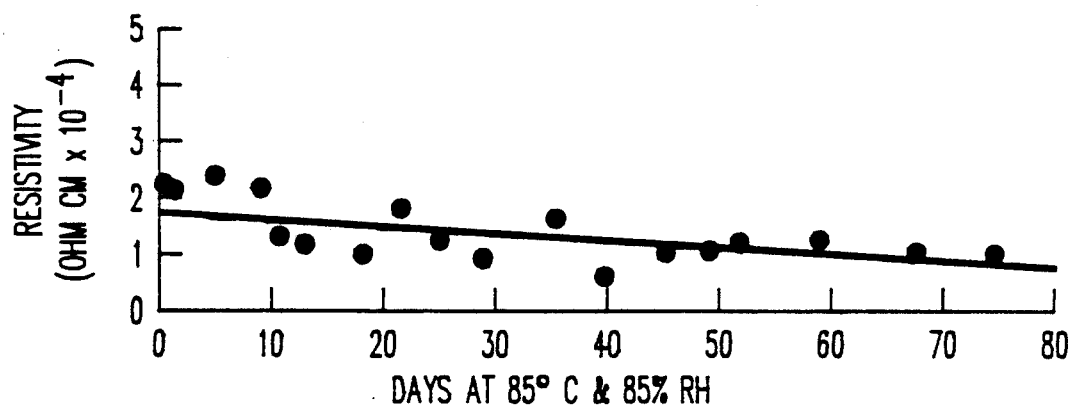
FIG. 5 illustrates an aging test performed at 85% RH and 85° C. for the adhesive of the present invention.

Long-term stability of the resistivity of the adhesive was tested for 82 days at 85° C. and 85% relative humidity without applied voltage. FIG. 5 shows a slow improvement over 80 days exposure.

Evaluation of the electrical characteristics of the conductive adhesives was accomplished by several methods. A test board was prepared which accommodates 10 SMT resistors in series. The SMT resistors used were common ceramic chip resistors with a resistance tolerance of 5% and a temperature coefficient of expansion of 200 ppm/°C. These resistors were attached using adhesive formulations and the resistance measured automatically. The tests were run for 18-24 hours with applied voltages of 6 and 25 volt to stimulate actual circuit conditions and test for silver migration. Readings on all the resistors, applied voltage, current, time, and temperature were taken at 15-minute intervals throughout the test. In addition, the resistivity of thin films of the adhesive prepared by drawing with a doctor blade was measured. Finally, a screen was prepared and used for applying the adhesive in a pattern specified by MIL-I-46058C to test insulation resistance at 500 V dc, and to establish dielectric withstandability at 1500 V ac.

STABILITY OF THE CONDUCTIVE ADHESIVE RESISTIVITY UNDER HIGH VOLTAGE

The conductive adhesive was examined under applied high voltage. MIL-I-46058C was used to determine the behavior under high overvoltage condition when applied alone or with a conformal coating insulation to an FR-4 laminate.

The test consists of two parts. The first part is an impulse test which measures the ability of the sample to withstand high voltage and survive without experiencing disruptive discharge. The second part is a measure of the level of the insulation resistance of the system. The first part is carried out at 1500 V ac rms and 60 Hz. The second part is carried out at 500 V dc for a period of two minutes. As specified by MIL-I-46058C, the dielectric withstand and insulation resistance tests were carried out in accordance with MIL-STD-202F Method 301 and Method 302, respectively. In addition to the tests conducted on the conductive adhesive sample, a second identical set of tests was also conducted on a conventional pretinned solder over copper circuit board pattern. This provided a reference sample and a basis to compare the results for the adhesive.

Results of this testing for both the solder reference sample and adhesive are shown in Tables 4 and 5.

TABLE 4

LEAKAGE CURRENT OF CONDUCTIVE ADHESIVE AND SOLDER PAR 4.8.7 OF MIL-I-46058-C MEASURED AT 1.5 kV RMS 60 Hz

| Specimen | Current (Amps $\times$ 10$^7$) |  | Specimen | Current (Amps $\times$ 10$^7$) |  |
| --- | --- | --- | --- | --- | --- |
| KFS 13-20 | 8.5 | +76* | Solder | 7.1 | +67* |
| KFS 13-20 | 8.5 | 76* | Solder | 7.1 | 67* |
| KFS 13-20 | 8.1 | 75* | Solder | 7.1 | 67* |
| KFS 13-20 + 1B31 | 7.0 | 75* | Solder + B566 | 7.1 | 67* |
| KFS 13-20 + 1B31 | 9.2 | 75* | Solder + B566 | 7.1 | 68* |
| KFS 13-20 + 1B31 | 8.5 | 76* | Solder + B566 | 7.0 | 68* |
| KFS 13-20 + B566 | 8.8 | 75* | Solder + 1B31 | 6.9 | 67* |
| KFS 13-20 + B566 | 8.5 | 76* | Solder + 1B31 | 6.9 | 67* |
| KFS 13-20 + B566 | 8.8 | 75* | Solder + 1B31 | 7.0 | 66* |

φ - Phase angle of the measurement. Capacitance range of the above board samples was 1.3 to 1.8 pF.
B566 - Westinghouse conformal coating.
1B31 - Humiseal conformal coating.

TABLE 5

DC INSULATION RESISTANCE PAR 4.8.6 OF MIL-I-46058-C MEASURED AT 500 V AFTER 2 MINUTES CHARGE

| Specimen | Resistance ($\Omega \times 10^{-14}$) | Specimen | Resistance ($\Omega \times 10^{-14}$) |
| --- | --- | --- | --- |
| KFS 13-20 | 1.9 | Solder | 2.8 |
| KFS 13-20 | 3.5 | Solder | 4.0 |
| KFS 13-20 | 7.0 | Solder | 1.7 |
| KFS 13-20 + 1B31 | 1.2 | Solder + B566 | 1.2 |
| KFS 13-20 + 1B31 | 4.5 | Solder + B566 | 1.6 |
| KFS 13-20 + B566 | 2.2 | Solder + B566 | 2.4 |
| KFS 13-20 + B566 | 2.5 | Solder + 1B31 | 1.1 |
| KFS 13-20 + B566 | 3.0 | Solder + 1B31 | 0.9 |
|  |  | Solder + 1B31 | 1.4 |

B566 - Westinghouse conformal coating.
1B31 - Humiseal conformal coating.

The adhesive experienced no disruptive discharge whether applied alone or in combination with either of the two representative conformal coatings used. (B566, a trade product of Westinghouse Electric Corporation; and Humiseal 1B31, a trade product of Humiseal Div. of Columbia Chase.) Its leakage currents were comparable to those of the solder reference sample during the respective impulse tests.

For the insulation resistance tests, Table 5 shows that the adhesive performed as well as the solder reference sample both alone and in combination with the conformal coatings tested.

Adhesion test results are given in Table 6. The adhesives were applied by screen printing. All values were an average of at least three measurements. Table 6 gives both the mass required to pull off the component as well as the force/area, assuming the adhesive joint to be the size of the metallized pads at the ends of the component. The diodes were much more difficult to adhere well because they were cylinders lying on their sides on the board, thus presenting only a small area for bonding.

TABLE 6

ADHESION STRENGTH OF SMT COMPONENTS ATTACHED WITH UV CONDUCTIVE ADHESIVES

| Adhesive | Component | Mass (gram) | Force/Area (wt/mm$^2$) |
| --- | --- | --- | --- |
| Conductive | Resistor | 357 | 6,725 |
| Conductive | Diode | 153 | 2,880 |

LAP SHEAR STRENGTH

The lap shear strength of the conductive adhesive was tested according to the ASTM D1002 method; it exhibited strength of 992 psi. Because the aluminum substrate of the samples blocks off the UV radiation to the adhesive, all the samples were cured thermally and with loading 3-10 psi on top of the samples. The conductive adhesive exhibited good bond strength.

THERMAL PROPERTIES OF ADHESIVES

The thermal stabilities of the adhesives were evaluated by TGA. The results are shown in Table 7.

TABLE 7

THERMAL STABILITY OF UV CONDUCTIVE ADHESIVES BY TGA

| Sample | Temperature (°C.) at which weight loss (%) occurs | | |
| --- | --- | --- | --- |
|  | 5% | 10% | 15% |
| KFS 13-20 | 390 | 410 | 445 |

The temperature for a 10% weight loss of the conductive adhesive was 410° C. The glass transition temperature (Tg) of the conductive adhesive was studied by TMA. It was 40° C. for UV cure only and 70° C. for UV plus thermal post-cure at 80° C. for 2 hours. The Tg range of adhesives indicates that the adhering components can be easily removed for repair by using a solder iron.

It would be appreciated that the above-described invention provides a UV curable electrically conductive adhesive with low resistivity, adequate lap shear strength, good thermal stability, very stable conductivity at high temperatures and high humidities. This adhesive may be applied by silk screen printing or automatic syringe dispenser and cured by UV in a short time. The adhesive of the present invention is a superior replacement for solder, and is especially useful in automated surface-mount technology for electronic circuit fabrication. The electronically conductive adhesive of the present invention may be used in conjunction in non-conductive adhesive, such as staking adhesives and/or conformal coatings to provide a finished printed wiring board product.

Whereas particular embodiments of the invention have been described above for purposes of illustration, it will be appreciated by those skilled in the art that numerous variations of the details may be made without departing from the invention as described in the appended claims.

We claim:

1. A conductive adhesive comprising:
   (A) about 5 to 20 weight percent of a blend of an acrylate epoxy and a urethane, a copolymer of an acrylate epoxy and a urethane, or mixtures thereof;
   (B) about 5 to 20 weight percent of a polyfunctional acrylate monomer selected from the group consisting of:
   1,3-butylene glycol diacrylate;
   1,4-butandiol diacrylate;
   Diethylene glycol diacrylate;
   1,6-hexanediol diacrylate;
   2,2-dimethylpropane-1,3-diacrylate;
   tetraethylene glycol diacrylate;
   tripropylene glycol diacrylate;
   Trimethylpropane triacrylate;
   pentaerythritol triacrtylate;
   ethoxylated trimethylol propane triacrylate;
   glyceryl propoxy triacrylate, and mixtures thereof;
   (C) about 1 to 7 weight percent of a photoinitiator; and
   (D) about 60 to 80 weight percent of a conductive filler selected from the group consisting of silver, iron, copper, nickel and mixtures thereof, and having a particle size of less than about 16 microns.

2. The adhesive of claim 1, wherein said conductive filler is silver.

3. The adhesive of claim 1, wherein said conductive filler is selected from the group consisting of metal flakes, metal powders, metal coated glass beads, metal coated glass flakes, metal coated mica and mixtures thereof.

4. The adhesive of claim 3, wherein said conductive filler is a metal flake.

5. The adhesive of claim 1, wherein said adhesive includes about 0.01 to 0.1 weight percent of additives selected from the group consisting of adhesion promoters, flow control agents and mixtures thereof.

6. The adhesive of claim 1, wherein said component (A) is a blend of an acrylate epoxy and a urethane.

7. The adhesive of claim 6, wherein said component (B) is selected from the group consisting of tetraethylene glycol diacrylate, glycerol propoxytriacrylate, and mixtures thereof.

8. The adhesive of claim 7, wherein said component (B) is tetraethylene glycol diacrylate.

9. The adhesive of claim 7, wherein said component (B) is glyceryl propoxy triacrylate.

10. The adhesive of claim 1, wherein said component (C) is selected from the group consisting of:
    benzoin ethers derivatives;
    alpha-acryloxime esters derivatives;
    benzil ketals derivatives;
    acetophenone derivatives;
    ketone-amine combination;
    primary or secondary aliphatic and aromatic amines and the ketones, and mixtures thereof.

11. The adhesive of claim 10, wherein said component (C) is selected from the group consisting of:
    isobutyl benzoin ether;
    isopropyl benzoin ether;
    benzoin ethyl ether;
    benzoin methyl ether;
    1-phenyl-1,2-propane-dione-2-(0-ethoxycarbonyl) oxime;
    2,2-dimethoxy-2-phenyl-acetophenone;
    benzyl;
    hydroxy-cyclo-hexyl phenyl ketone;
    diethoxyacetophenone;
    2-hydroxy-2-methyl-1-phenyl-propane-1-one;
    benzophenone;
    chlorothioxanthone;
    2-chlorothioxanthone;
    isopropyl thioxanthone;
    2-methylthioxanthone;
    chlorine functional substituted benzophenone;
    halogen substituted alkyl-arylketone, wherein said halogen is chlorine, bromine and iodine and mixtures thereof.

12. A solder paste comprising the adhesive of claim 1.

13. A printed wire board having the adhesive of claim 1 applied thereon.

* * * * *